United States Patent [19]
Shellenberger

[11] 4,271,354
[45] Jun. 2, 1981

[54] MANUAL BELT ELECTRO-OPTICAL CONTROL

[75] Inventor: Richard H. Shellenberger, Asheville, N.C.

[73] Assignee: SHS Research Labs, Inc., Asheville, N.C.

[21] Appl. No.: 65,349

[22] Filed: Aug. 9, 1979

[51] Int. Cl.³ ............................ G02F 1/01; H01J 40/14
[52] U.S. Cl. ................................. 250/211 K; 250/225
[58] Field of Search ............... 250/211 K, 225, 231 R, 250/231 SE, 232, 233, 237 R

[56] References Cited

U.S. PATENT DOCUMENTS

| | | | |
|---|---|---|---|
| 1,985,044 | 12/1934 | Lyle | 250/232 |
| 2,254,022 | 8/1941 | Whitaker | 250/225 |
| 2,813,460 | 11/1957 | Wallin | 250/233 |
| 3,087,069 | 4/1963 | Moncrieff-Yeates | 250/211 K |
| 3,171,034 | 2/1965 | Tomasulo et al. | 250/237 R |
| 3,194,967 | 7/1965 | Mash | 250/211 K |
| 3,258,601 | 6/1966 | Suleski | 250/211 K |
| 3,306,159 | 2/1967 | Beall, Jr. et al. | 250/225 |
| 3,358,150 | 12/1967 | Summer | 250/227 |
| 3,539,816 | 11/1970 | Chamberlin | 250/211 K |
| 3,639,769 | 2/1972 | Clark | 250/211 K |
| 3,859,617 | 1/1975 | Oka et al. | 250/211 K X |
| 3,892,961 | 7/1975 | Bachmann | 250/211 K |

OTHER PUBLICATIONS

L. R. Moskowitz, "Selecting Magnets for Reed Switch Actuation" Automation-Oct. 1968; pp. 66–71.

*Primary Examiner*—David C. Nelms
*Assistant Examiner*—Edward P. Westin
*Attorney, Agent, or Firm*—Stevens, Davis, Miller & Mosher

[57] ABSTRACT

An electro-optical control comprising a housing, a source of light, a photocell, and an endless belt having a substantially planar run manually movable with a finger. The belt has portions of differing light penetrability. Members on the housing guide the belt in an endless path when the one run of the belt is manually moved. The photocell and the light source are positioned interior of and exterior of the belt. Thus, when the belt is moved, the amount of light from the light source which strikes the photocell is varied, controlling the photocell. The control can include a stop member secured to the belt, engageable with the housing to limit the movement of the belt. In an alternative embodiment, the control includes a light source, a pair of photocells positioned substantially side by side and first and second disc-shaped polarizing filters positioned between the light source and the photocells. One filter is manually rotatable. One filter is also divided into two substantially semicircular filter portions whose directions of polarization are perpendicular to each other so that as the rotatable filter is rotated, the amount of light from the source striking one of the photocells is increased and the amount of light striking the other of the photocells is simultaneously decreased. The rotatable filter is controlled through an endless belt. An endless belt can also control for example a linear motion variable resistor or other devices.

7 Claims, 13 Drawing Figures

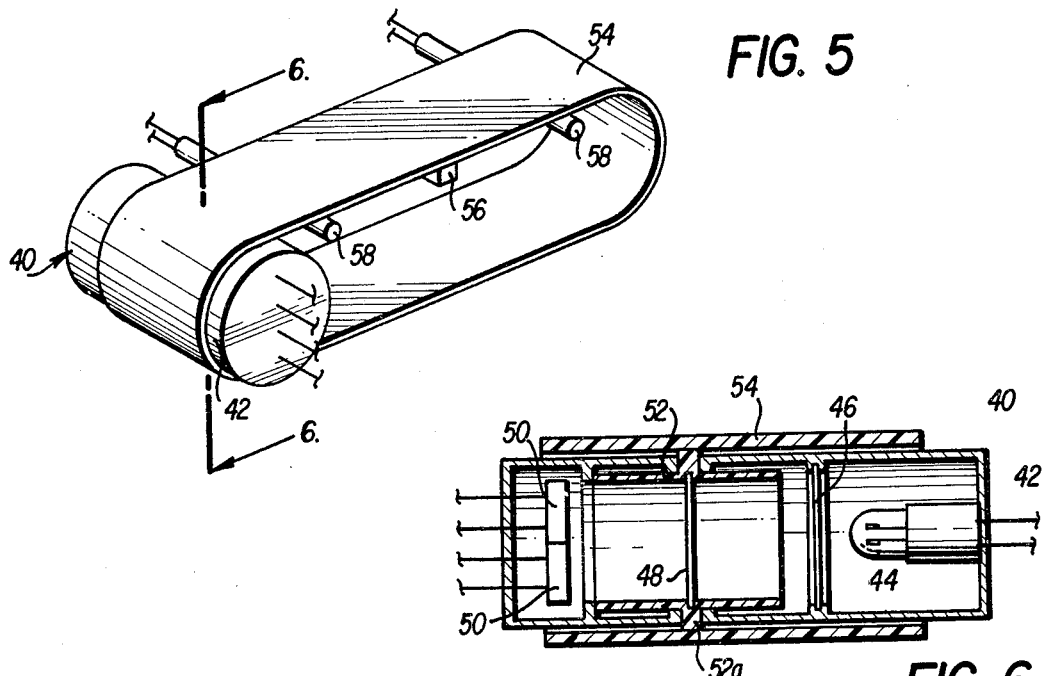
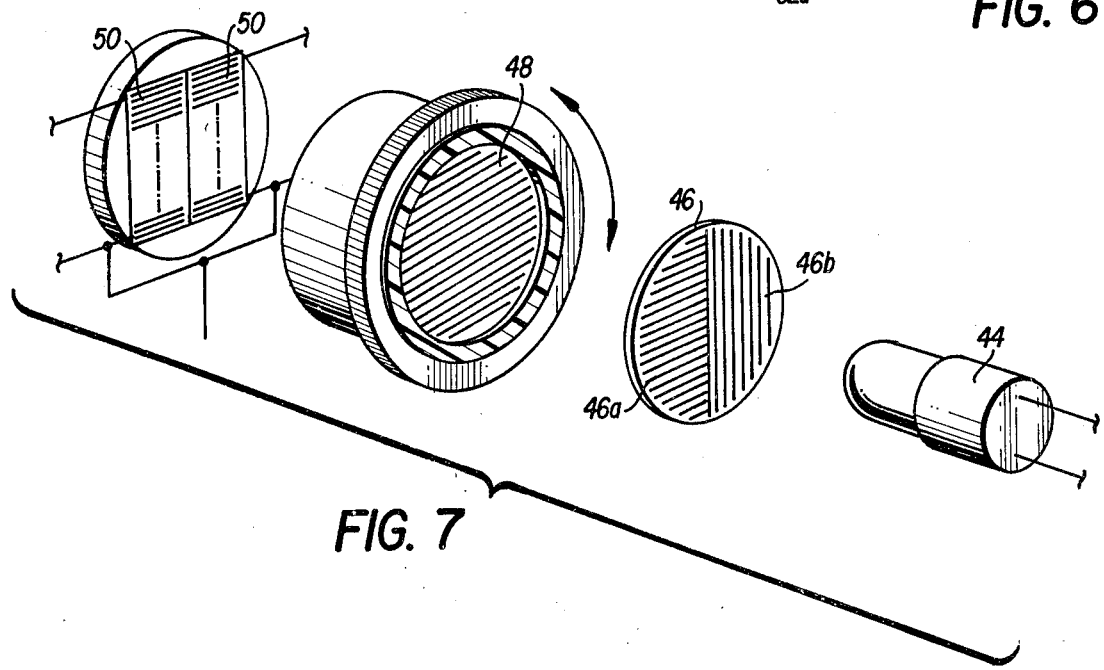
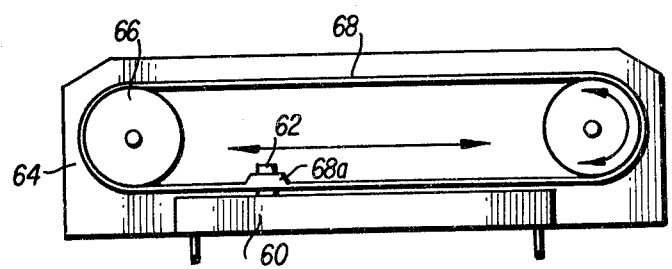

MANUAL BELT ELECTRO-OPTICAL CONTROL

BACKGROUND OF THE INVENTION

1. Field of the Invention

This invention relates to controls, such as electro-optical controls, and controls for linear motion variable resistors and other devices.

2. Description of the Prior Art

In prior art controls, it is difficult to conveniently, easily and accurately control various devices. With prior art controls, it is necessary to use at least two fingers of one hand to grasp a control knob in order to apply sufficient friction to properly turn the control.

BRIEF DESCRIPTION OF THE INVENTION

It is an object of Applicant's invention to provide a control for electro-optical devices, linear motion variable resistors and other devices, which is simple in construction, and yet accurate and easy to control.

It is a further object of this invention to provide a control which is lightweight and inexpensive.

It is a further object of this invention to provide a control which is easy to manufacture.

It is a further object of this invention to provide a control which presents a low profile when mounted on a panel or circuit board.

It is a further object of this invention to provide an electro-optical control in which there is no mechanical connection between the controlling element and the controlled photocell.

It is a further object of this invention to provide a control in the form of an endless belt which can be easily and accurately manually moved by a finger.

It is a further object of this invention to provide a control which is electrically noiseless.

It is a further object of this invention to provide a control which will not deteriorate due to wear in the course of operation and will have a longer operational life.

With this invention, in the form of a belt type control having a planar run which can be manually moved with a finger, control is effected by linear motion, which is a very natural motion. Control is easily affected with only one finger or thumb. The control can be operated by a physically impaired person or one wearing gloves, as might be required of controls used in surgery, extreme hot or cold, food processing, under water, in space, etc.

Further objects and the features of this invention will become apparent to those skilled in the art as the description thereof proceeds.

BRIEF DESCRIPTION OF THE DRAWINGS

FIG. 5 is a perspective view of a third embodiment of the invention;

FIG. 6 is a cross-sectional view along the line 6—6 of FIG. 5;

FIG. 7 is an exploded view of some of the components shown in FIG. 6; and

FIG. 8 is a side view of a fourth embodiment of the invention.

DETAILED DESCRIPTION OF THE PREFERRED EMBODIMENTS

Figure 1:
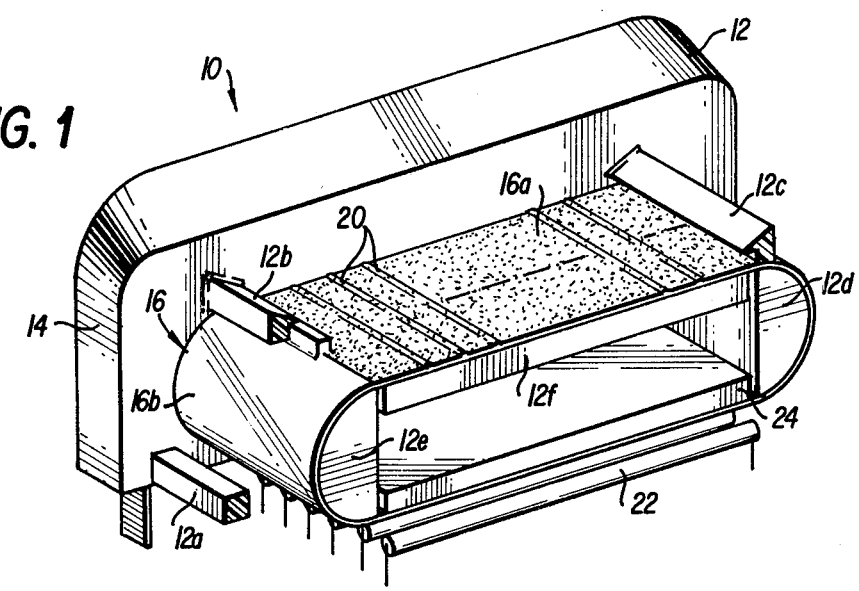
FIG. 1 is a perspective view of a first embodiment of the invention with some parts omitted for clarity.

Shown in FIG. 1 is an electro-optical control 10 which includes a housing 12 having a plurality of support components 12a, 12b, 12c, 12d and 12e extending therefrom. As shown in FIG. 1, the parts 12d and 12e are semi-circular in cross section. The housing also includes a first sidewall 14 shown in FIG. 1. Not shown for clarity is a complementary similar sidewall 14 on the opposite side of a flexible belt 16 to be subsequently described. The two sidewalls completely shield the belt interior from external light except that which passes through the belt from a light source 22 to be described.

The belt 16 is extended and guided around the parts 12d and 12e. The upper run of the belt 16 is manually movable with a finger and may be of a size slightly larger than that of the end of a human finger when pressed for example against another stationary part 12f of the housing. The stationary housing parts, particularly parts 12d, 12e, and 12f, define a guide track for the belt 16. Secured integrally to the belt is a single stop member 18 which is movable between and which abuts the housing parts 12b and 12c which define the limit positions between which the stop member may be moved. The belt may also have integral frictional members 20 along its upper run to frictionally engage a finger for manually moving the belt. Disposed below the belt is a source of light, such as a flourescent lamp, 22. Located within the belt is a photocell 24.

Figure 2:
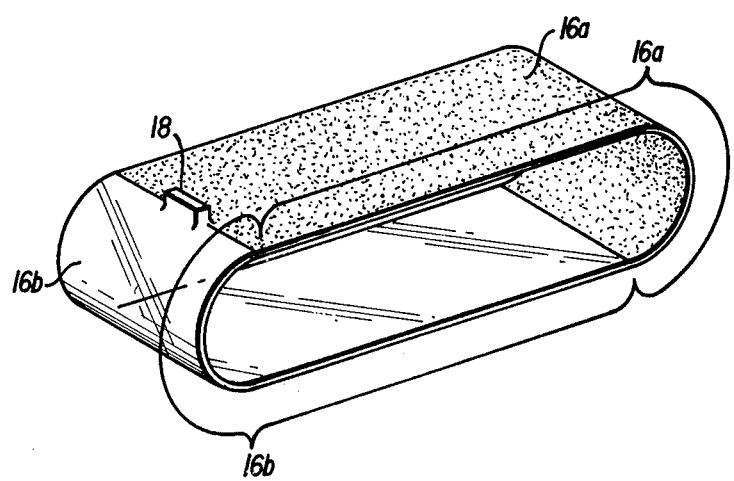
FIG. 2 is a perspective view of the belt shown in FIG. 1.
Figure 3A:
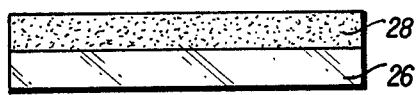
FIGS. 3a, 3b, 3c, 3d, 3e and 3f show alternative belt constructions.
Figure 3D:
Figure 3B:
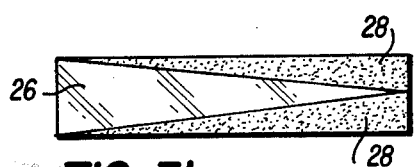
Figure 3E:
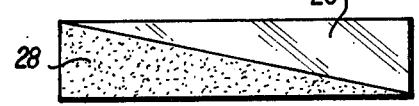
Figure 3C:
Figure 3F:
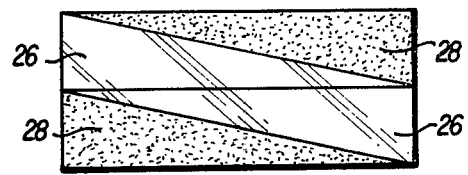

With reference to FIG. 2, the belt is divided into two sections 16a and 16b. The section 16a is opaque throughout its extent and the section 16b is transparent throughout its extent. When the belt is moved to the right as shown in FIG. 1 from the position shown therein, the opaque portion 16a begins to move between the light source and the photocell. As a result, as is well known in the art, when the amount of light which strikes the photocell is varied, its resistance or other output is thereby varied. By moving the belt between the fixed portions 12b and 12c, the amount of light striking the photocell 24 can be varied from 100% to 0 and thereby completely vary the output of the photocell 24.

In view of the above, it should be apparent that this invention provides a structurally non-complex yet accurate control.

It is contemplated in this invention that more than one photocell 24 could be provided within the belt. Such photocells could be arranged side by side. In addition, the belt could be divided into for example two separate belt sections divided lengthwise with various arrangements of opacity and transparency along their length. Various alternative arrangements for the belt surface 16a are shown in FIGS. 3a, 3b, 3c, 3d, 3e, and 3f. In those figures, the transparent sections are designated 26 and the opaque sections are designated 28.

Figure 4:
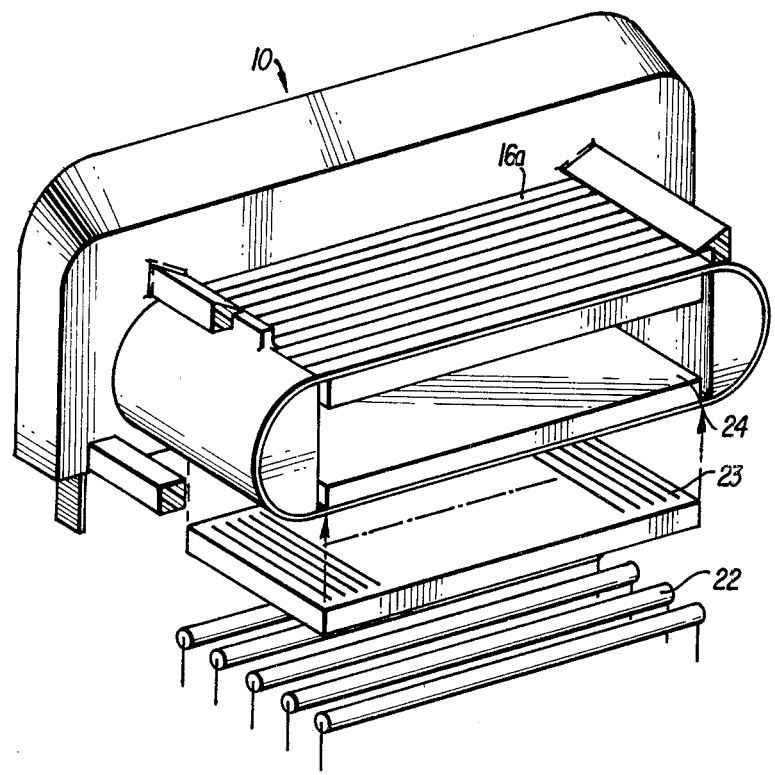
FIG. 4 is a perspective view of a second embodiment of the invention.

FIG. 4 shows a second embodiment of the invention which is generally similar to the first embodiment. In FIG. 4, the belt section 16a is formed as a movable polarized filter whose direction of polarization is longitudinal. Beneath the lower run of the belt and between it and the light source 22 is a fixed polarized filter 23 whose direction of polarization is perpendicular to that of the belt section 16a. In operation, when the upper belt run of the belt is manually moved from left to right in FIG. 4, the movable filter section 16a moves over the fixed filter 23, and the amount of light striking the photocell 24 can be varied from 100% to 0% to thereby completely vary the output of the photocell 24.

With reference to FIGS. 5 through 7, the third embodiment of the invention will be described. In this embodiment, an electro-optical control 40 is provided. The control 40 includes a stationary light-tight housing 42 having therein a light source 44, a fixed polarizing filter 46, and a rotatably movable polarizing filter 48.

As shown in FIG. 7, the fixed filter is divided into two semi-circular filter portions 46a and 46b whose lines of polarization are substantially perpendicular to each other. As is apparent from FIG. 7, one of the filter portion 46a is for functional cooperation with one of the photocells 50 and the other filter portion 46b is for functional cooperation with the other photocell 50.

It is also apparent from FIG. 7, that upon rotation of the filter element 48, the amount of light from the light source 44 which will strike one of the photocells 50 is increased while that striking the other one of the photocells 50 will be proportionately and simultaneously decreased. As a result of such structure, it is possible to provide a dual inversely proportional control for the photocells 50 upon rotation of the rotatable filter 48.

With reference to FIG. 6, the rotatable filter 48 is mounted in a substantially cylindrical rotatable control member 52 having a section 52a which projects radially outwardly through the housing 42. A flexible belt 54 is wrapped around the housing 42. The belt 54 is in direct contact with the section 52a. The belt can be held in extended portion by providing a housing with a semicircular stationary portion such as that designated 12d in FIG. 1. In addition, the housing 42 could be secured to a stationary sidewall like that shown at 14 in FIG. 1. When the upper run of the belt is manually moved with a finger, the control section 52a is rotated to thereby rotate the rotatable filter 48 to vary the amount of light from the light source 44 which can strike the photocells 50 to thereby vary the output of the photocells 50 as desired.

In this embodiment, it is also possible to provide an on/off control between the limits of minimum and maximum control of the photocells 50. For example, with reference to FIG. 5, a magnet 56 is secured to the belt and a pair of spaced reed limit switches 58 are secured to the housing. As is well known in the art, when the magnet is moved adjacent the reed switches, they would be actuated. The movement of the magnet between the reed switches 48 provides an on/off control and limits movement of the filter element 48 between the minimum and maximum desired control positions.

"Photocell" as used herein refers to (1) a photoconductive cell whose conductivity or resistance varies in accordance with the amount of light falling on it (such cells are well known per se, are commercially available and have for example an insulated substrate coated with cadmium-sulphide) and (2) a cell which converts light into electricity (such as the cadmium or selenium cell of a light meter).

Each photocell or plurality of photocells may be electrically connected to electrical components, such as lights, speakers, motors, machines, etc. to variably control them as desired where changes in circuit parameters are desired.

With reference to FIG. 8, a fourth embodiment of the invention will be described. The fourth embodiment of the invention relates to a control for a linear motion variable resistor. Linear motion variable resistors are well known per se. The resistor 60 includes, as is well known in the art, a contact 62 which is movable longitudinally in the direction of the arrows to vary the output resistance from the resistor. Applicant's invention relates to a control for such a resistor. The control includes a stationary housing 64 on which are mounted a pair of manually rotatable rollers 66 about which is trained a flexible belt 68, the upper run of which can be manually moved with a finger. The belt 68 includes an enlarged reinforced portion 68a having a hole defined therethrough. As shown in FIG. 8, the contact 62 extends through the hole in the enlarged portion 68a. Upon manual movement of the upper run of the belt with the finger, the contact 62 may be moved longitudinally along the resistor to thereby easily control and vary its output as desired.

Although the invention has been described above with reference to specific embodiments thereof, variations will occur to those skilled in the art which are within the scope of the invention as defined in the following claims.

What I claim is:

1. An electro-optical control comprising:
   a housing;
   a source of light;
   a photocell;
   an endless belt having a substantially planar run reversibly, intermittently, and manually alone movable with a finger applied to the exterior of the belt, said belt having portions of different light penetrability from each other over its extent;
   guide means on the housing holding the belt in an extended position and guiding it in an endless path when the one run of the belt is manually moved;
   either said light source or said photocell being within the belt and the other of said light source and said photocell being exterior of and adjacent to the belt.

2. An electro-optical control as claimed in claim 1, further comprising a stop member secured to the belt, said stop member being engageable with the housing to limit the extent of movement of the belt along the endless path.

3. An electro-optical control comprising:
   a housing;
   a source of light;
   a photocell;
   an endless belt having a substantially planar run reversibly, intermittently, and manually alone movable with a finger applied to the exterior of the belt, said belt comprising a movable polarized filter;
   guide means on the housing holding the belt in an extended position and guiding it in an endless path when the one run of the belt is manually moved;
   one of said light source and said photocell being within the belt and the other one of said light source and said photocell being exterior of and adjacent the belt; and
   a fixed polarized filter, whose direction of polarization is perpendicular to that of the movable filter, between the light source and the photocell and adjacent the belt.

4. An electro-optical control as claimed in claim 3, further comprising a stop member secured to the belt, said stop member being engageable with the housing to limit the extent of movement of the belt along the endless path.

5. An electro-optical control comprising:
   a light source;

a pair of photocells positioned substantially side by side;

first and second disc-shaped polarizing filters positioned between the light source and the photocells;

one of said first and second filters being rotatable about an axis through its center and substantially perpendicular to its plane;

one of said first and second filters being divided into two substantially semi-circular filter portions whose directions of polarization are perpendicular to each other;

a control member having a substantially circular outer periphery, said rotatable filter being concentrically mounted within the control member;

a housing containing said light source, said photocells and said polarizing filters, said control member extending outside of said housing; and an endless belt having a substantially planar run reversibly, intermittently, and manually alone movable with a finger applied to the exterior of the endless belt, said belt extending around the outer periphery of the housing and the control member, said belt being held in an extended position and guided in an endless path when the one run of the belt is manually moved, whereby as said rotatable filter is rotated the amount of light from said light source striking one of the photocells is increased and the amount of light striking the other of said photocells is simultaneously decreased.

6. An electro-optical control, comprising:

a light source;

a photocell;

a first fixed polarizing filter between the light source and the photocell;

a second disc-shaped polarizing filter between the light source and the photocell;

a control member having a substantially circular outer periphery, said second filter being substantially concentrically mounted within the control member;

a housing containing said light source, said photocell and said first and second polarizing filters, said control member extending outside of the housing; and an endless belt having a substantially planar run reversibly, intermittently, and manually alone movable with a finger applied to the exterior of the endless belt, said belt extending around the outer periphery of the housing and the control member, said belt being held in an extended position and guided in an endless path when the one run of the belt is manually moved, whereby the control member and second filter are rotated to vary the amount of light from the light source which strikes the photocell.

7. An electro-optical control as claimed in claim 6, further comprising:

first and second reed limit switches spaced from each other along the belt; and a magnet secured to the belt to activate the switches when the magnet is moved adjacent thereto.

* * * * *